(12) United States Patent
Orlowske (10) Patent No.: US 12,184,270 B2
(45) Date of Patent: Dec. 31, 2024

(54) IGBT/MOSFET DESATURATION CIRCUITY W/ REVERSE POLARITY PROTECTION

(71) Applicant: Rosemount Aerospace Inc., Burnsville, MN (US)

(72) Inventor: Joseph Orlowske, Burnsville, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 146 days.

(21) Appl. No.: 18/098,049

(22) Filed: Jan. 17, 2023

(65) Prior Publication Data

US 2024/0243742 A1   Jul. 18, 2024

(51) Int. Cl.
    *H03K 17/082* (2006.01)

(52) U.S. Cl.
    CPC ..... *H03K 17/0822* (2013.01); *H03K 17/0828* (2013.01)

(58) Field of Classification Search
    CPC .......................................... H03K 17/082–0828
    See application file for complete search history.

(56) References Cited

U.S. PATENT DOCUMENTS

| | | | |
|---|---|---|---|
| 5,200,879 A * | 4/1993 | Sasagawa | H03K 17/0828 361/18 |
| 5,210,479 A | 5/1993 | Kimura et al. | |
| 6,275,093 B1 | 8/2001 | Shekhawat et al. | |
| 7,760,005 B2 | 7/2010 | de Rooij et al. | |
| 7,768,337 B2 | 8/2010 | Bayerer | |
| 8,760,218 B2 * | 6/2014 | Zhu | H02M 1/08 327/423 |
| 9,214,934 B2 | 12/2015 | Cottell | |
| 10,263,412 B2 | 4/2019 | Huber | |

(Continued)

FOREIGN PATENT DOCUMENTS

| | | |
|---|---|---|
| CN | 1354561 A | 6/2002 |
| CN | 202550515 U | 11/2012 |
| IN | 353362 B | 12/2020 |

OTHER PUBLICATIONS

Extended European Search Report for European Patent Application No. 24152450.3, dated Jun. 6, 2024, 8 pages.

*Primary Examiner* — Jared Fureman
*Assistant Examiner* — Christopher J Clark
(74) *Attorney, Agent, or Firm* — Kinney & Lange, P.A.

(57) ABSTRACT

Apparatus and associate methods relate to desaturation protection of a metal-oxide-semiconductor field-effect transistor (MOSFET) or an insulated-gate bipolar transistor (IGBT). Desaturation protection circuitry provides desaturation protection to the MOSFET or IGBT as well protection of the desaturation protection circuitry, should such circuitry be connected to reverse power. The desaturation protection circuitry determines a desaturation condition based on a control voltage generated by a Zener-diode-resistor network conductively coupled between first and second conduction nodes of the MOSFET or IGBT. The Zener-diode-resistor network is coupled to first and second conduction nodes via a rectifying diode that is configured to protect the desaturation protection circuitry from reverse bias power. Negative feedback limits current through a signal isolation device that is conductively isolated from the output node, which indicates whether the desaturation condition has been determined.

20 Claims, 4 Drawing Sheets

(56) References Cited

U.S. PATENT DOCUMENTS

| | | | |
|---|---|---|---|
| 10,473,710 B2 | 11/2019 | Sullivan | |
| 11,146,256 B2 | 10/2021 | Lin | |
| 2015/0180463 A1* | 6/2015 | Peltonen | H02M 1/08 |
| | | | 327/109 |
| 2018/0183228 A1* | 6/2018 | Huber | G01R 19/16571 |
| 2018/0301296 A1 | 10/2018 | Hsu | |

* cited by examiner

IGBT/MOSFET DESATURATION CIRCUITY W/ REVERSE POLARITY PROTECTION

BACKGROUND

Transistors such as metal-oxide-semiconductor field-effect transistors (MOSFETs) or insulated-gate bipolar transistors (IGBTs) can sometimes be subject to short-circuit events. MOSFETs and/or IGBTs can also have a number of other failure modes that can cause excessive currents or power dissipation such as incorrect user connections or component failures. Such events can lead to damage to the MOSFET or IGBT. Because of such potential damage, various systems for detecting and protecting MOSFETs and/or IGBTs against such events have been used. Such systems, if inadvertently connected to reverse polarity power, can themselves suffer damage.

SUMMARY

A system for desaturation protection of a metal-oxide-semiconductor field-effect transistor (MOSFET) or an insulated-gate bipolar transistor (IGBT) includes first and second input nodes configured to sense a voltage difference across first and second conduction terminals of the MOSFET or the IGBT connected thereto. The system further includes an output node configured to indicate whether the voltage difference exceeds a desaturation condition. The system further includes a Zener-diode-resistor network conductively coupled, via a rectifying diode configured to block reverse-polarity current conduction through the Zener-diode-resistor network, between the first and the second input nodes and comprising a pull-up network connected to a pull-down network at a first control node. The Zener-diode-resistor network is configured to generate a first control voltage at the first control node based on the voltage difference. The system further includes a signal isolation device having a device-input current path and a device-output current path conductively isolated from one another. The signal isolation device is configured to generate an output signal, via the device-output current path, at the output node in response to current conduction through the device-input current path. The system further includes a first switch having a first-switch input control terminal coupled to the first control node and a first-switch output conduction path coupled to both the device-input current path and a control network. The first switch is configured to turn on in response to the first control voltage exceeding a first-switch threshold voltage, thereby conducting current through the device-input current path and generating a second control voltage in the control network. The system further includes a second switch having a second-switch input control terminal coupled to the control network and a second-switch output conduction path conductively coupled to the pull-up network. The second switch is configured to conduct current through the pull-up network in response to the second control voltage exceeding a second-switch threshold voltage, thereby causing negative feedback control of the current conducted through the device-input current path.

A method for desaturation protection of a metal-oxide-semiconductor field-effect transistor (MOSFET) or an insulated-gate bipolar transistor (IGBT), including sensing a voltage difference via first and second input nodes across first and second conduction terminals of the MOSFET or the IGBT connected thereto. The method further includes generating a first control voltage at a first control node based on the voltage difference via a Zener-diode-resistor network conductively coupled, via a rectifying diode configured to block reverse-polarity current conduction through the Zener-diode-resistor network, between the first and the second input nodes and comprising a pull-up network connected to a pull-down network at the first control node. The method further includes turning on a first switch having a first-switch input control terminal coupled to the first control node and a first-switch output conduction path coupled to a control network, in response to the first control voltage exceeding a first-switch threshold voltage, thereby conducting current through the first-switch output conduction path and generating a second control voltage in the control network. The method further includes generating an output signal via a signal isolation device having a device-input current path, conductively coupled to the first-switch output conduction path, and a device-output current path, conductively isolated from the device-input current path, via the device-output current path, in response to current conduction through the device-input current path. The method further includes turning on a second switch having a second-switch input control terminal coupled to the control network and a second-switch output conduction path conductively coupled to the pull-up network, in response to the second control voltage exceeding a second-switch threshold voltage such that current conducts through the pull-up network, thereby causing negative feedback control of the current conducted through the device-input current path. The method further includes indicating, by receiving the output signal at an output node conductively coupled to the device-output current path, whether the voltage difference exceeds a desaturation condition.

DETAILED DESCRIPTION

According to the techniques of this disclosure, a system for desaturation protection can be used to detect and protect against a desaturation event at an insulated-gate bipolar transistor (IGBT) or metal-oxide-semiconductor field-effect transistor (MOSFET). The system does so by detecting when a specified voltage is exceeded and providing a signal to the control circuit of the IGBT or the MOSFET so as to mitigate an over-current condition in the device. The system can also be configured to protect circuit components of a desaturation detection circuit in the case that power is reversed across the system.

Figure 1:
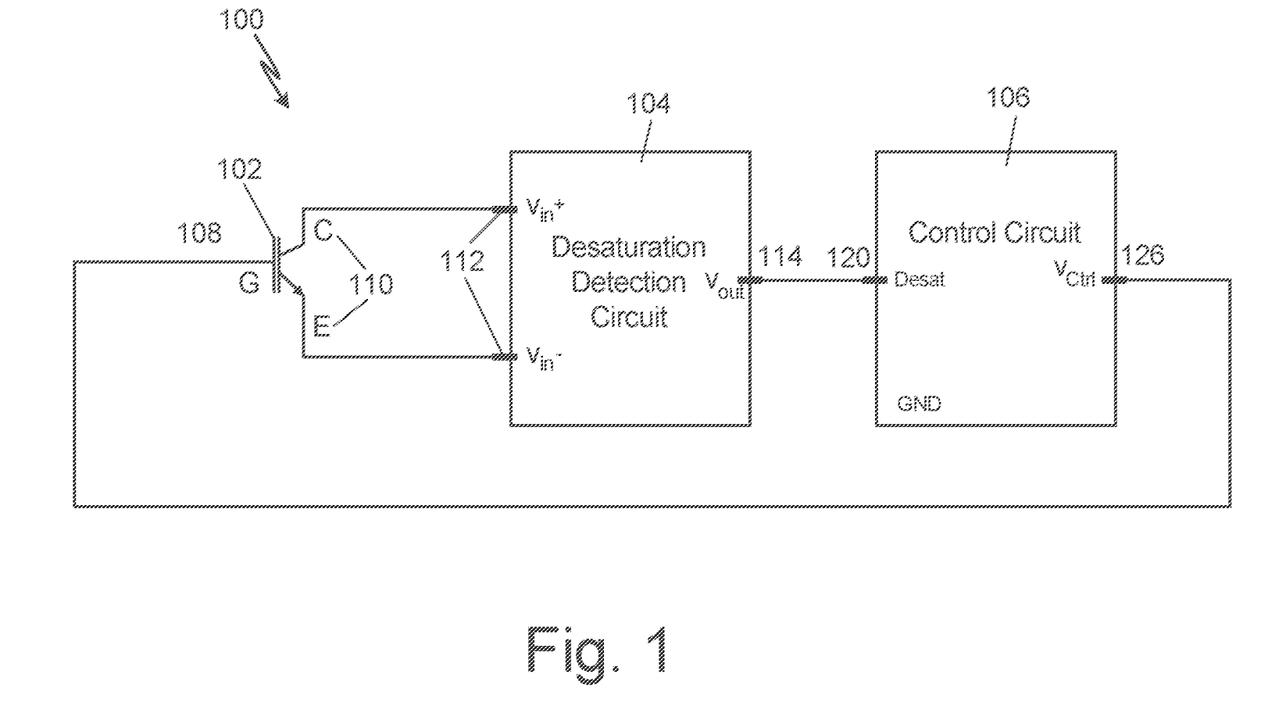
FIG. 1 is a block diagram of a desaturation protection system for an insulated-gate bipolar transistor (IGBT) or a metal-oxide-semiconductor field-effect transistor (MOSFET).

FIG. 1 is a block diagram of desaturation protection system 100. System 100 includes IGBT 102, desaturation detection circuit 104, and control circuit 106. IGBT 102 includes control terminal 108 (i.e., Gate G) and conduction terminals 110 (i.e., Collector C and emitter E). Desaturation detection circuit 104 includes input voltage nodes 112 and output node 114. Control circuit 106 includes desaturation signal node 120 and gate drive node 126. IGBT 102 is conductively coupled to desaturation detection circuit 104 via a connection between conduction terminals 110 of IGBT 102 and input voltage nodes 112 of desaturation detection circuit 104. Output node 114 of desaturation detection circuit 104 is conductively coupled to an input port of control circuit 106, which is desaturation signal node 120. Control circuit 106 is conductively coupled to IBGT 102 at an output port of control circuit 106 such that gate drive node 126 is conductively coupled to control terminal 108 of IGBT 102.

Instead of providing desaturation detection to IGBT 102, system 100 can also be used to provide desaturation detection and protection of other devices, such as, for example, a MOSFET. In the case that IGBT 102 of FIG. 1 is replaced with a MOSFET, conduction terminals 110 can be the drain and source of the MOSFET. In the depicted embodiment, in which IGBT 102 is provided desaturation detection, conduction terminals 110 can be the collector and the emitter of the IGBT. In either embodiment, conduction terminals 110 indicate the terminals across which a desaturation condition is monitored.

Input voltage nodes 112 are connected to conduction terminals 110, which can be connected to other circuitry including but not limited to bias circuitry or switched loads. Input voltage nodes 112 are inputs to desaturation detection circuit 104 and are configured to sense a voltage difference across conduction terminals 110 of IGBT 102. Desaturation detection circuit 104 is configured to detect whether the voltage difference across input voltage nodes 112 exceeds a desaturation condition. The desaturation condition can be any voltage that is indicative of a desaturation event to IGBT 102. Such a desaturation condition can be specified in a data sheet for the IGBT, for example. Desaturation detection circuit 104 is configured to generate a signal indicative of whether the voltage difference across input voltage nodes 112 exceeds a desaturation condition at output node 114. In some embodiments, the signal may be a logic low signal, wherein a low voltage value is indicative of a desaturation condition, and a high voltage value is indicative of normal operation. In other embodiments, the signal may be a logic high signal, wherein a high voltage value is indicative of a desaturation condition, and a low voltage value is indicative of normal operation.

The signal generated at output node 114 is transmitted to control circuit 106 at desaturation signal node 120. Control circuit 106 can then evaluate the signal received at desaturation signal node 120 to determine whether IGBT 102 is in the desaturation condition. Control circuit 106 can have other inputs so as to determine if the desaturation condition is present for IGBT 102. For example, control circuit 106 may be configured to determine whether IGBT 102 is on and if sufficient time as elapsed since it was turned on. Such an evaluation permits control circuit 106 to determine whether the desaturation condition can cause damage to a device in an on state (e.g., the device is dissipating too much power), or if the desaturation condition will have no effect on a device because the device is in an off state. Control circuit 106 can make this determination in various ways. For example, control circuit 106 is configured to determine whether IGBT 102 is on based upon a system control voltage at control terminal 108 of IGBT 102.

In response to the desaturation condition being exceeded, control circuit 106 can produce a signal to turn IGBT 102 fully off via gate drive node 126. Control circuit 106 houses a gate drive circuit of which gate drive node 126 is the output. Thus, when the desaturation condition is exceeded, the gate drive circuit within control circuit 106 is configured to produce a signal at gate drive node 126 which turns off IGBT 102. Control circuit 106 can also be configured to ignore the output of desaturation detection circuit 104 if IGBT 102 is supposed to be off. This can be accomplished in various ways. In one example, control circuit 106 can incorporate a delay such that the output of desaturation detection circuit 104 is ignored while waiting for IGBT 102 to turn on.

Desaturation detection circuit 104 is further configured to be protected if a reversal of power occurs. Reversal of power may occur due to improper installation of system 100, for example, wherein an external voltage source is connected in a reverse polarity such that the positive and negative terminals of input voltage nodes 112 are reversed. In such a case, internal circuitry of desaturation detection circuit 104 can ensure that circuit components are not damaged. Greater detail about the circuit implementation of desaturation detection circuit 104 will be described below in the description of FIG. 2.

System 100 provides the advantage of detecting a desaturation event via desaturation detection circuit 104 and mitigating the effects of the desaturation event by reducing a gate voltage at IGBT/MOSFET 102 via control circuit 106. System 100 is also advantageous because of the reverse polarity protection afforded within desaturation detection circuit 104, wherein the internal circuitry is protected in the case of a reversal of power within system 100.

Figure 2:
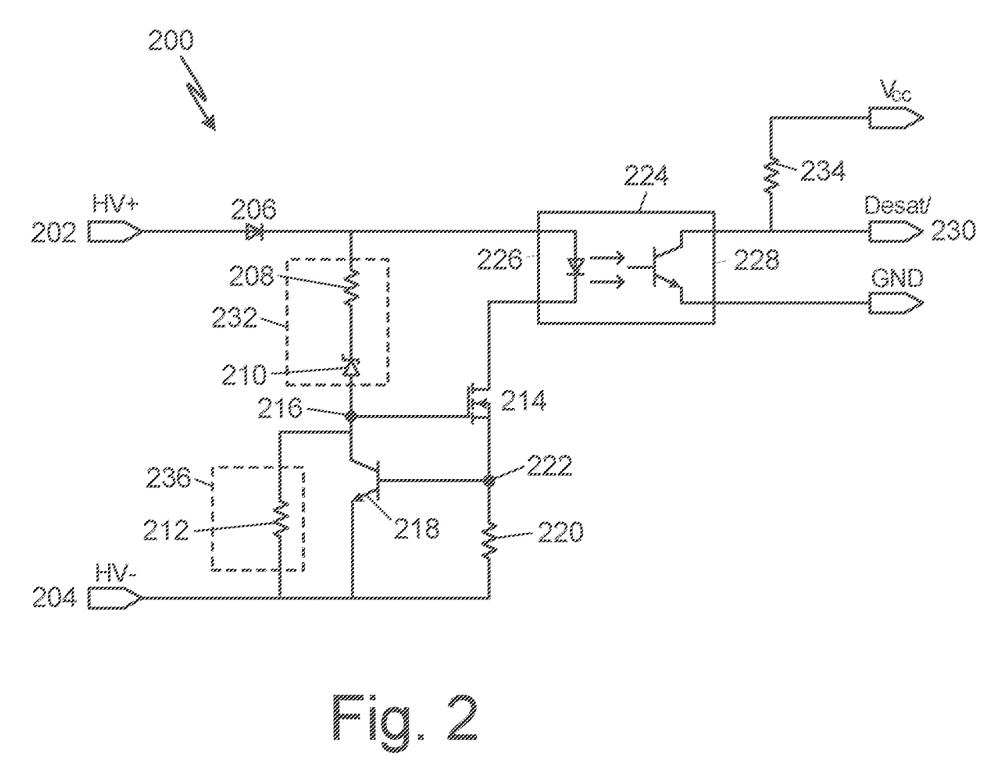
FIG. 2 is a circuit implementation of a desaturation detection and protection circuit.

FIG. 2 is a circuit implementation of a desaturation detection circuit 200. Desaturation detection circuit 200 is an embodiment of a circuit implementation of desaturation detection circuit 104 of FIG. 1. Desaturation detection circuit 200 includes first input node 202, second input node 204, rectifying diode 206, pull-up network 232, and pull-down network 236. Pull-up network 232 includes pull-up resistor 208 and Zener diode 210. Pull-down network 236 includes pull-down resistor 212. Desaturation detection circuit 200 further includes first switch 214, first control node 216, second switch 218, control network 220, and second control node 222. Desaturation detection circuit 200 further includes opto-isolator 224, output node 230, and pull-up resistor 234. Opto-isolator 224 includes input current path 226 and output current path 228.

In the circuit embodiment of FIG. 2, first input node 202 is conductively coupled to rectifying diode 206, in a series configuration. Rectifying diode is connected to pull-up network 232. Pull-up network 232 includes a series connection of pull-up resistor 208 and Zener diode 210. Second input node 204 is conductively coupled with pull-down network 236. Pull-down network 236 includes pull-down resistor 212. Pull-up network 232 and pull-down network 236 are connected at first control node 216. First control node 216 is also conductively coupled to first switch 214. First switch 214 includes an output conduction path conductively coupled to opto-isolator 224 at input current path 226. The output conduction path of first switch 214 is also conductively coupled to second control node 222 and control network 220. Second control node 222 is conductively coupled to second switch 218. Second switch 218 is conductively coupled to pull-up network 232, and specifically to Zener diode 210. Output current path 228 of opto-isolator 224 is coupled to output node 230, which is also connected to pull-up resistor 234. Output node 230 can be coupled to control circuit 106 as depicted in FIG. 1.

In operation, desaturation detection circuit 200 operates when a voltage difference is incident across a first conduction terminal and a second conduction terminal of a MOSFET or an IGBT. The first and second conduction terminals may be the collector and emitter of the IGBT or the drain and source of the MOSFET. In either case, first input node 202 and second input node 204 sense a voltage difference across the first conduction terminal and the second conduction terminal of the MOSFET or IGBT. Current conducts through rectifying diode 206 when the voltage difference is at a first polarity such that rectifying diode 206 is forward-biased. Rectifying diode 206 also blocks current conduction in the case that power is reversed through the circuit and hence the voltage polarity is in the opposite direction, and rectifying diode 206 is reverse-biased. Reversal of power may take place due to improper installation of the system, for example. If power is reversed, rectifying diode 206 blocks conduction of current thereby providing protection of other circuit components which may otherwise be subject to high voltage levels. Thus, in a reverse polarity voltage condition, rectifying diode 206 blocks conduction of current to pull-up network 232 including pull-up resistor 208 and Zener diode 210. As such, rectifying diode 206 is configured to operate at high blocking voltages. In some applications, a system comprising desaturation detection circuit 200 operates at high voltages on the order of 270 volts. In such an application, rectifying diode 206 is configured to operate when the voltage across the diode is at least 270 volts. In other applications, rectifying diode 206 is configured to operate at voltages as high as 1200 volts.

When the voltage sensed across first input node 202 and second input node 204 is of a polarity wherein rectifying diode 206 permits current conduction in a forward-biased direction, current conducts through pull-up network 232 including pull-up resistor 208 and Zener diode 210 only when the voltage difference exceeds the Zener-breakdown voltage of Zener diode 210, such that the Zener-breakdown condition is met. In some embodiments, the Zener-breakdown voltage of Zener diode 210 can be between 2 to 8 volts, for example. When Zener diode 210 is conducting, current conducts through pull-down resistor 212. First control node 216 is coupled between pull-up network 232 and pull-down network 236. A voltage is produced at first control node 216 based on the input voltage difference and the voltage drop across pull-up network 232 and pull-down network 236. The voltage at first control node 216 can be determined by evaluating the voltage division between pull-up resistor 208 and pull-down resistor 212 based on the respective resistance values, while also taking into account the voltage drop of Zener diode 210 and rectifying diode 206. In the depicted embodiment, assuming ideal components and the voltage across input terminals 112 is greater than the sum of $V_{ZBD}$ and $V_D$ the voltage at first control node 216 is given by:

$$V_{CTRL} = [(V_{IN+} - V_{IN-}) - V_{ZBD} - V_D] \cdot \frac{R_{PD}}{R_{PD} + R_{PU}}$$

Where VCTRL is the voltage at first control node 216, $V_{IN+}$ is the voltage at first input node 202, $V_{IN-}$ is the voltage at second input node 204, $V_{ZBD}$ is the Zener-breakdown voltage, $V_D$ is the rectifying diode 206 forward voltage drop, $R_{PD}$ is the resistance of pull-down resistor 212 and $R_{PU}$ is the resistance of pull-up resistor 208. Thus, the resistance of pull-up resistor 208 and pull-down resistor 212 can be selected to create a predetermined ratio such that the voltage at control node 216 is based on a product of the predetermined ratio and the voltage difference and the Zener-breakdown voltage of Zener diode 210 within pull-up network 232.

First control node 216 is also coupled to a control terminal of first switch 214. In the depicted embodiment, first switch 214 is depicted as an N-channel MOSFET. When the voltage at first control node 216, and hence the control terminal of first switch 214, exceeds a first switch threshold voltage, first switch 214 turns on and begins to conduct current along an output conduction path. First switch 214 conducts current through input current path 226 and through control network 220. In the depicted embodiment, control network 220 includes a resistor. In other embodiments, control network 220 can include one or more resistors. A voltage drop across control network 220 creates a voltage at second control node 222. Second control node 222 is coupled to an input control terminal of second switch 218. In the depicted embodiment, second switch 218 is depicted as an NPN BJT. Second switch 218 can also be a MOSFET or other transistor. When the voltage at second control node 222, and hence the control terminal of second switch 218, exceeds a second switch threshold voltage, second switch 218 is turned on and begins to conduct current. Current conducting through an output conduction path of second switch 218 conducts through the pull-up network including Zener diode 210 and pull-up resistor 208, such that there is negative feedback at first control node 216. This negative feedback limits the current that is conducted by first switch 214 through input current path 226.

As described, when first switch 214 is in an on-condition due to a voltage at first control node 216, current conducts through input current path 226 of opto-isolator 224. Opto-isolator 224 can be any signal isolation device configured to transfer electrical signals between two conductively isolated circuits. Current conducting through input current path 226 is conductively isolated from current flowing through output current path 228 of opto-isolator 224. Opto-isolator 224 generates an output signal via output current path 228 in response to current conduction through input current path 226. The current conduction through output current path 228 results in current flow through pull-up resistor 234 to an electrical ground. As a result, output node 230 is pulled to a low voltage state, which indicates that the desaturation condition is exceeded. In some embodiments, the output signal may be a logic low signal, wherein a low voltage value is indicative of a desaturation condition, and a high voltage value is indicative of normal operation. Thus, desaturation detection circuit 200 outputs a signal indicative of whether the voltage difference across first input node 202 and second input node 204 exceeds a desaturation condition via output node 230.

Desaturation detection circuit 200 is configured to provide advantages including desaturation detection, current limiting, and protection against a reversal of voltage polarity in circuit 200. Circuit 200 provides desaturation detection by outputting a signal indicative of a desaturation condition of the input voltage across first input node 202 and second input node 204 at output node 230. Circuit 200 is also capable of current limiting based on the feedback current from the configuration and operation of second switch 218. Circuit 200 also provides protection against a reversal of voltage polarity via rectifying diode 206, which does not conduct current in a reverse bias direction. Thus, in the event of a reverse power mode, current does not conduct through circuit 200 and components are protected.

Figure 3:
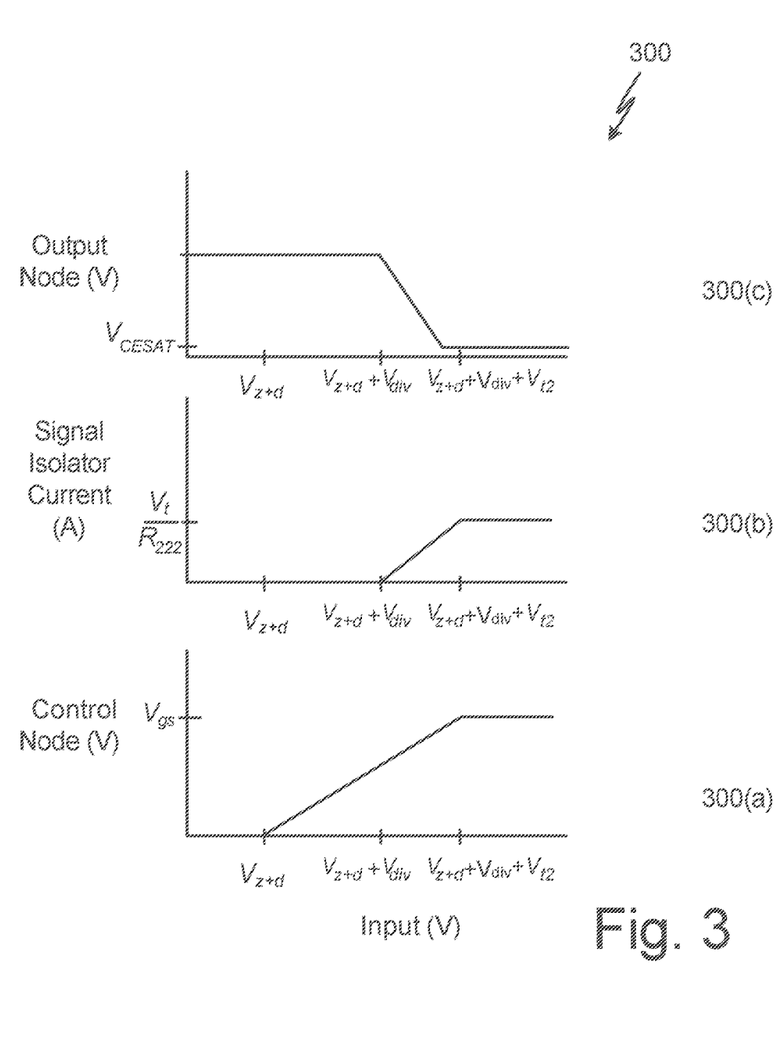
FIG. 3 is a graph depicting the input/output relationship of the desaturation detection and protection circuit.

FIG. 3 depicts input/output graphs 300. Input/output graphs 300 will be described in relation to the circuit components labeled in FIG. 2. Graph 300(a) depicts the relationship between the input voltage and a voltage at first control node 216. As described in FIG. 2, current does not conduct through first control node 216 until the voltage drop across Zener diode 210 is large enough to put Zener diode 210 in a conduction mode. Thus, as shown in graph 300(a), there is zero voltage at control node 216 while the input voltage is lower the sum of the Zener breakdown voltage for Zener diode 210 and the forward voltage drop for rectifying diode 206. The depicted embodiment assumes ideal diodes. However, in the real-world implementation, diodes will not behave with ideal characteristics. Thus, the voltage at first control node 216 will have a slight linear increase until the Zener breakdown voltage for Zener diode 210 is reached.

The voltage at control node 216 begins to increase linearly once the input voltage reaches the sum of the Zener breakdown voltage for Zener diode 210 and the forward voltage drop for rectifying diode 206. Again, as described, in the case of non-ideal diodes, the voltage at first control node 216 will be non-zero before the Zener breakdown voltage and rectifying diode forward voltage drop is reached. The slope of the linear increase after the Zener breakdown voltage is reached is determined by the voltage division of pull-up resistor 208 and pull-down resistor 212. Thus, the slope of the linear increase of the voltage at control node 216 is approximately equal to $$\frac{R_{PD}}{R_{PD}+R_{PU}}$$

where $R_{PD}$ is pull-down resistor 212 and $R_{PU}$ is pull-up resistor 208. In a practical implementation, an impedance associated with Zener diode 210 results in the slope being slightly less than $$\frac{R_{PD}}{R_{PD}+R_{PU}}.$$

The voltage at control node 216 continues to increase, with the slope based on pull-up resistor 208 and pull-down resistor 212, as a function of the input voltage until current limiting by second switch 218 occurs. Current limiting of second switch 218 activates when the voltage at second control node 222 exceeds a threshold voltage required to turn on second switch 218. As described in FIG. 2, this generates negative current feedback at first control node 216, thereby limiting the voltage at first control node 216. Thus, in the embodiment wherein first switch 214 is a MOSFET, current limiting occurs when the voltage at the first control node is slightly greater than the sum of the gate-to-source threshold voltage ($V_{gs(th)}$) and the on voltage of second switch 218 ($V_{t2}$, typically about 0.7 Volts for a BJT). This value is depicted in graph 300(a) on the input voltage axis as $V_{z+d}+V_{div}+V_{t2}$. Thus, when the current at first control node 216 is limited, the voltage at first control node 216 remains constant despite any additional input voltage.

Graph 300(b) depicts the relationship between the input voltage and a current through input current path 226 of opto-isolator 224. As described in FIG. 2, current does not conduct through input current path 226 until first switch 214 is in an on-condition. First switch 214 does not turn on until Zener diode 210 and rectifying diode 206 are conducting and the voltage at first control node 216 is greater than a threshold voltage of first switch 214. Thus, the input voltage must be great enough such that the Zener diode 210 and rectifying diode 206 are conducting and such that the voltage at first control node 216, based on the voltage division between pull-up resistor 208 and pull-down resistor 212, is greater than the threshold voltage of first switch 214. This level of input voltage is depicted in graph 300(b) by the sum of the Zener breakdown voltage and rectifying diode voltage ($V_{z+d}$) and the remaining voltage required to turn on the first switch at first control node 216 after considering the voltage division of pull-up resistor 208 and pull-down resistor 212 ($V_{div}$). While the input voltage is less than the sum of ($V_{z+d}$) and ($V_{div}$), there is no current conducting through input current path 226.

The current through input current path 226 begins to increase linearly once the input voltage is equal to the sum of ($V_{z+d}$) and ($V_{div}$). The current through input current path 226 can be calculated by determining the voltage across the resistor of control network 220. Hence, the slope of the linear relationship between the input voltage and the current through input current path 226 is inversely proportional to the resistance of the resistor of control network 220. As described, graphs 300 of FIG. 3 assume ideal components. In a real-world implementation, opto-isolator 224 can contain a diode with a forward-bias drop voltage, which can have an effect on the depicted relationship.

The current through input current path 226 continues to increase, with the slope based on the resistance of the resistor of control network 220, as a function of the input voltage until current limiting by second switch 218 occurs. As described above, current limiting of second switch 218 activates when the voltage at second control node 222 exceeds a threshold voltage required to turn on second switch 218. When second switch 218 is turned on, the current through input current path 226 reaches a maximum value of $$\frac{V_{t2}}{R_{222}},$$

where $V_{t2}$ is the threshold voltage of second switch 218 and $R_{222}$ is the resistance of the resistor of control network 220.

Graph 300(c) depicts the relationship between the input voltage and voltage at output node 230. As shown, the output node voltage starts at a high state before first switch 214 is turned on. The high state is maintained when first switch 214 is off because current does not conduct through input current path 226. Hence no corresponding signal is produced at output current path 228 to permit current flow through pull-up resistor 234 and to an electrical ground to pull down the voltage of output node 230.

The voltage at output node 230 begins to decrease when first switch 214 is on. When first switch 214 is on, current conducts through input current path 226, and hence current begins to conduct at output current path 228. Current thus flows through pull-up resistor 234 and to an electrical ground. Signal isolation device may be an opto-isolator wherein current flows at output current path 228 when a switch within the opto-isolator is turned on. In some embodiments, the switch within the opto-isolator is a BJT. In such an embodiment, the voltage at output node 230 linearly decreases until it reaches a minimum of $V_{CESAT}$, that is the collector-emitter voltage of the BJT in a saturation mode. The voltage at output node 230 is configured to bottom out at $V_{CESAT}$ prior to the point at which the input voltage is great enough to trigger the current limiting portion of desaturation detection circuit 200.

Graphs 300 depict the ability of desaturation detection circuit 200 to signal a desaturation mode at output node 230 when a desaturation condition is met. Graphs 300 also demonstrate how current limiting circuitry of desaturation detection circuit 200 ensures that excessive current does not flow through opto-isolator 224 and that first control node 216 does not supply excessive voltage to first switch 214.

Figure 4:
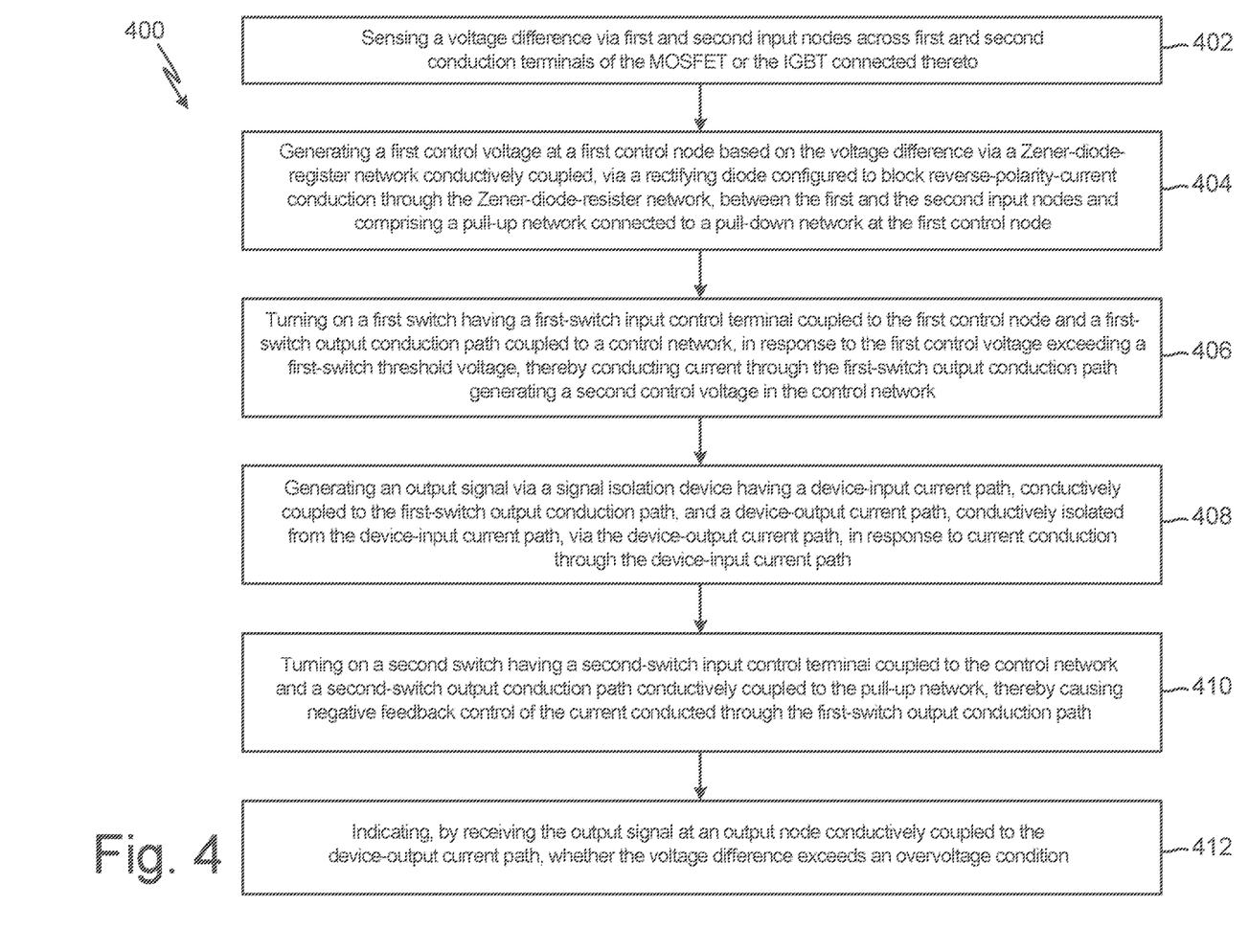
FIG. 4 is a method detailing a process for detecting desaturation of an IGBT.

FIG. 4 depicts desaturation protection method 400. At step 402, first and second input nodes can sense a voltage difference across first and second conduction terminals of a MOSFET or IGBT.

At step 404, a first control voltage is generated at the first control node based on the voltage difference via a Zener-diode-resistor network. The Zener-diode-resistor network can be conductively coupled to a rectifying diode which is configured to block reverse-polarity current conduction through the Zener-diode-resistor network. The Zener-diode-resistor network can include a pull-up network connected to a pull-down network at a control node. In some embodiments, the pull-up network includes a Zener diode in series with a resistor, while the pull-down network comprises a resistor.

At step 406, a first switch turns on via a first-switch input control terminal which is coupled to the first control node. The first switch is configured to turn on in response to the first control voltage exceeding a first-switch threshold voltage. When the first switch is on, current may conduct through a first switch output conduction path which is coupled a control network. As a result, the current conducts through the control network to generate a second control voltage.

At step 408, a signal isolation device generates an output signal. The signal isolation device can have a device-input current path and a device-output current path conductively isolated from one another. The device-input current path can be conductively coupled to the first-switch output conduction path such that current conducts through the device-input current path when the first switch is on. The signal isolation device can generate the output signal at the device-output current path in response to current conduction through the device-input current path. In some embodiments, the signal isolation device is an opto-isolator, though the signal isolation device can be any device configured to transfer electrical signals between two isolated circuits.

At step 410, a second switch turns on via a second-switch input control terminal. The second switch is configured to turn on in response to the second control voltage exceeding a second-switch threshold voltage. When the second switch is on, current may conduct through a second switch output conduction path which is coupled to the pull-up network. The conduction of current through the pull-up network causes negative feedback control of the current conducted through the first-switch output conduction path.

At step 412, an output node can indicate whether the voltage difference across the first and second input nodes exceeds a desaturation condition by receiving the output signal from the device-output current path. In some embodiments, the output node indicates a logic low signal when the voltage difference exceeds the desaturation condition.

The system described herein allows for desaturation detection and protection using a desaturation detection circuit and a control circuit to turn off a MOSFET or IGBT. The system provides desaturation detection with current limiting capabilities, such that desaturation circuit components are not subject to excessive current flow. Finally, the system allows for protection against a reversal of power within the system such that desaturation circuit components are protect in the case of a reverse bias input voltage polarity.

Discussion of Possible Embodiments

The following are non-exclusive descriptions of possible embodiments of the present invention.

A system for desaturation protection of a metal-oxide-semiconductor field-effect transistor (MOSFET) or insulated-gate bipolar transistor (IGBT) includes first and second input nodes configured to sense a voltage difference across first and second conduction terminals of the MOSFET or the IGBT connected thereto. The system further includes an output node configured to indicate whether the voltage difference exceeds a desaturation condition. The system further includes a Zener-diode-resistor network conductively coupled, via a rectifying diode configured to block reverse-polarity current conduction through the Zener-diode-resistor network, between the first and the second input nodes and comprising a pull-up network connected to a pull-down network at a first control node. The Zener-diode-resistor network is configured to generate a first control voltage at the first control node based on the voltage difference. The system further includes a signal isolation device having a device-input current path and a device-output current path conductively isolated from one another. The signal isolation device is configured to generate an output signal, via the device-output current path, at the output node in response to current conduction through the device-input current path. The system further includes a first switch having a first-switch input control terminal coupled to the first control node and a first-switch output conduction path coupled to both the device-input current path and a control network. The first switch is configured to turn on in response to the first control voltage exceeding a first-switch threshold voltage, thereby conducting current through the device-input current path and generating a second control voltage in the control network. The system further includes a second switch having a second-switch input control terminal coupled to the control network and a second-switch output conduction path conductively coupled to the pull-up network. The second switch is configured to conduct current through the pull-up network in response to the second control voltage exceeding a second-switch threshold voltage, thereby causing negative feedback control of the current conducted through the device-input current path.

The system of the preceding paragraph can optionally include, additionally and/or alternatively, any one or more of the following features, configurations and/or additional components:

A further embodiment of the foregoing system, further comprising the IGBT having first and second conduction nodes conductively coupled to the first and the second input nodes, respectively.

A further embodiment of any of the foregoing systems, further comprising the MOSFET having first and second conduction nodes conductively coupled to the first and the second input nodes, respectively.

A further embodiment of any of the foregoing systems, further comprising a control circuit having an input port conductively coupled to the output node and having an output port conductively coupled to a control terminal of the IGBT or the MOSFET. The control circuit is configured to determine whether the IGBT or the MOSFET is on based, at least in part, upon a system control voltage at the control terminal of the IGBT or the MOSFET.

A further embodiment of any of the foregoing systems, wherein the control circuit supplies a signal to a control terminal of the IGBT or the MOSFET in response to the desaturation condition, thereby turning off the IGBT or the MOSFET.

A further embodiment of any of the foregoing systems, wherein the pull-up network comprises a Zener diode in series with a resistor, the Zener diode configured to conduct current when a voltage across the Zener diode exceeds a Zener-breakdown condition.

A further embodiment of any of the foregoing systems, wherein the pull-down network comprises a resistor.

A further embodiment of any of the foregoing systems, wherein the signal isolation device is an opto-isolator.

A further embodiment of any of the foregoing systems, wherein the rectifying diode is configured to operate at a voltage of at least 270 volts.

A further embodiment of any of the foregoing systems, wherein the rectifying diode is configured to operate at a voltage up to 1200 volts A further embodiment of any of the foregoing systems, wherein a pull-up resistor within the pull-up network and a pull-down resistor within the pull-down network are selected to create a predetermined ratio such that the first control voltage is based on a product of the predetermined ratio and the voltage difference and a Zener-breakdown voltage of a Zener diode within the pull-up network.

A further embodiment of any of the foregoing systems, wherein the control network is one or more resistors.

A further embodiment of any of the foregoing systems, wherein the first switch is a metal-oxide-semiconductor field-effect transistor (MOSFET).

A further embodiment of any of the foregoing systems, wherein the second switch is a bipolar-junction-transistor (BJT).

A method for desaturation protection of a metal-oxide-semiconductor field-effect transistor (MOSFET) or an insulated-gate bipolar transistor (IGBT), including sensing a voltage difference via first and second input nodes across first and second conduction terminals of the MOSFET or the IGBT connected thereto. The method further includes generating a first control voltage at a first control node based on the voltage difference via a Zener-diode-resistor network conductively coupled, via a rectifying diode configured to block reverse-polarity current conduction through the Zener-diode-resistor network, between the first and the second input nodes and comprising a pull-up network connected to a pull-down network at the first control node. The method further includes turning on a first switch having a first-switch input control terminal coupled to the first control node and a first-switch output conduction path coupled to a control network, in response to the first control voltage exceeding a first-switch threshold voltage, thereby conducting current through the first-switch output conduction path and generating a second control voltage in the control network. The method further includes generating an output signal via a signal isolation device having a device-input current path, conductively coupled to the first-switch output conduction path, and a device-output current path, conductively isolated from the device-input current path, via the device-output current path, in response to current conduction through the device-input current path. The method further includes turning on a second switch having a second-switch input control terminal coupled to the control network and a second-switch output conduction path conductively coupled to the pull-up network, in response to the second control voltage exceeding a second-switch threshold voltage such that current conducts through the pull-up network, thereby causing negative feedback control of the current conducted through the device-input current path. The method further includes indicating, by receiving the output signal at an output node conductively coupled to the device-output current path, whether the voltage difference exceeds a desaturation condition.

The method of the preceding paragraph can optionally include, additionally and/or alternatively, any one or more of the following features, configurations and/or additional components:

A further embodiment of the foregoing method, further comprising evaluating, via a control circuit having an input port conductively coupled to the output node and having an output port conductively coupled to a control terminal of the IGBT or the MOSFET, whether the IGBT or the MOSFET is on based, at least in part, upon a system control voltage at the control terminal of the IGBT or the MOSFET.

A further embodiment of any of the foregoing methods, wherein the control circuit supplies a signal to a control terminal of the IGBT or the MOSFET in response to the desaturation condition, thereby turning off the IGBT or the MOSFET.

A further embodiment of any of the foregoing methods, wherein the pull-up network comprises a Zener diode in series with a resistor, the Zener diode configured to conduct current when a voltage across the Zener diode exceeds a Zener-breakdown condition.

A further embodiment of any of the foregoing methods, wherein the pull-down network comprises a resistor.

A further embodiment of any of the foregoing methods, wherein the signal isolation device is an opto-isolator.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for desaturation protection of a metal-oxide-semiconductor field-effect transistor (MOSFET) or an insulated-gate bipolar transistor (IGBT), the system comprising:
   first and second input nodes configured to sense a voltage difference across first and second conduction terminals of the MOSFET or the IGBT connected thereto;
   an output node configured to indicate whether the voltage difference exceeds a desaturation condition;
   a Zener-diode-resistor network conductively coupled, via a rectifying diode configured to block reverse-polarity current conduction through the Zener-diode-resistor network, between the first and the second input nodes and comprising a pull-up network connected to a pull-down network at a first control node, wherein, the Zener-diode-resistor network is configured to generate a first control voltage at the first control node based on the voltage difference;
   a signal isolation device having a device-input current path and a device-output current path conductively isolated from one another, the signal isolation device configured to generate an output signal, via the device-output current path, at the output node in response to current conduction through the device-input current path;
a first switch having a first-switch input control terminal coupled to the first control node and a first-switch output conduction path coupled to both the device-input current path and a control network, wherein the first switch is configured to turn on in response to the first control voltage exceeding a first-switch threshold voltage, thereby conducting current through the device-input current path and generating a second control voltage in the control network; and
a second switch having a second-switch input control terminal coupled to the control network and a second-switch output conduction path conductively coupled to the pull-up network, wherein the second switch is configured to conduct current through the pull-up network in response to the second control voltage exceeding a second-switch threshold voltage, thereby causing negative feedback control of the current conducted through the device-input current path.

2. The system of claim 1, further comprising the IGBT having first and second conduction nodes conductively coupled to the first and the second input nodes, respectively.

3. The system of claim 1, further comprising the MOSFET having first and second conduction nodes conductively coupled to the first and the second input nodes, respectively.

4. The system of claim 1, further comprising a control circuit having an input port conductively coupled to the output node and having an output port conductively coupled to a control terminal of the IGBT or the MOSFET, wherein the control circuit is configured to determine whether the IGBT or the MOSFET is on based, at least in part, upon a system control voltage at the control terminal of the IGBT or the MOSFET.

5. The system of claim 4, wherein the control circuit supplies a signal to a control terminal of the IGBT or the MOSFET in response to the desaturation condition, thereby turning off the IGBT or the MOSFET.

6. The system of claim 1, wherein the pull-up network comprises a Zener diode in series with a resistor, the Zener diode configured to conduct current when a voltage across the Zener diode exceeds a Zener-breakdown condition.

7. The system of claim 1, wherein the pull-down network comprises a resistor.

8. The system of claim 1, wherein the signal isolation device is an opto-isolator.

9. The system of claim 1, wherein the rectifying diode is configured to operate at a voltage of at least 270 volts.

10. The system of claim 1, wherein the rectifying diode is configured to operate at a voltage up to 1200 volts.

11. The system of claim 1, wherein a pull-up resistor of the pull-up network and a pull-down resistor of the pull-down network are selected to create a predetermined ratio such that the first control voltage is based on a product of the predetermined ratio and the voltage difference and a Zener-breakdown voltage of a Zener diode within the pull-up network.

12. The system of claim 1, wherein the control network is one or more resistors.

13. The system of claim 1, wherein the first switch is a metal-oxide-semiconductor field-effect transistor (MOSFET).

14. The system of claim 1, wherein the second switch is a bipolar-junction-transistor (BJT).

15. A method for desaturation protection of a metal-oxide-semiconductor field-effect transistor (MOSFET) or an insulated-gate bipolar transistor (IGBT), the method comprising:
sensing a voltage difference via first and second input nodes across first and second conduction terminals of the MOSFET or the IGBT connected thereto;
generating a first control voltage at a first control node based on the voltage difference via a Zener-diode-resistor network conductively coupled, via a rectifying diode configured to block reverse-polarity current conduction through the Zener-diode-resistor network, between the first and the second input nodes and comprising a pull-up network connected to a pull-down network at the first control node;
turning on a first switch having a first-switch input control terminal coupled to the first control node and a first-switch output conduction path coupled to a control network, in response to the first control voltage exceeding a first-switch threshold voltage, thereby conducting current through the first-switch output conduction path and generating a second control voltage in the control network;
generating an output signal via a signal isolation device having a device-input current path, conductively coupled to the first-switch output conduction path, and a device-output current path, conductively isolated from the device-input current path, via the device-output current path, in response to current conduction through the device-input current path;
turning on a second switch having a second-switch input control terminal coupled to the control network and a second-switch output conduction path conductively coupled to the pull-up network, in response to the second control voltage exceeding a second-switch threshold voltage such that current conducts through the pull-up network, thereby causing negative feedback control of the current conducted through the first-switch output conduction path; and
indicating, by receiving the output signal at an output node conductively coupled to the device-output current path, whether the voltage difference exceeds a desaturation condition.

16. The method of claim 15, further comprising:
evaluating, via a control circuit having an input port conductively coupled to the output node and having an output port conductively coupled to a control terminal of the IGBT or the MOSFET, whether the IGBT or the MOSFET is on based, at least in part, upon a system control voltage at the control terminal of the IGBT or the MOSFET.

17. The method of claim 16, wherein the control circuit supplies a signal to the control terminal of the IGBT or the MOSFET in response to the desaturation condition, thereby turning off the IGBT or the MOSFET.

18. The method of claim 15, wherein the pull-up network comprises a Zener diode in series with a resistor, the Zener diode configured to conduct current when a voltage across the Zener diode exceeds a Zener-breakdown condition.

19. The method of claim 15, wherein the pull-down network comprises a resistor.

20. The method of claim 15, wherein the signal isolation device is an opto-isolator.

* * * * *

UNITED STATES PATENT AND TRADEMARK OFFICE
CERTIFICATE OF CORRECTION

PATENT NO. : 12,184,270 B2
APPLICATION NO. : 18/098049
DATED : December 31, 2024
INVENTOR(S) : Joseph Orlowske Page 1 of 1

It is certified that error appears in the above-identified patent and that said Letters Patent is hereby corrected as shown below:

On the Title Page

Item (54) Title and in the Specification Column 1, Line 1:
Delete "IGBT/MOSFET DESATURATION CIRCUITY W/ REVERSE POLARITY PROTECTION"
Insert -- IGBT/MOSFET DESATURATION CIRCUIT W/ REVERSE POLARITY PROTECTION --

Signed and Sealed this
Twenty-fifth Day of February, 2025

Coke Morgan Stewart
*Acting Director of the United States Patent and Trademark Office*